United States Patent
Shiau

(10) Patent No.: US 6,940,058 B2
(45) Date of Patent: Sep. 6, 2005

(54) INJECTION MOLDED IMAGE SENSOR MODULE

(75) Inventor: Simon Shiau, Hsinchu Hsien (TW)

(73) Assignee: Kingpak Technology, Inc., Hsinchu Hsien (TW)

( * ) Notice: Subject to any disclaimer, the term of this patent is extended or adjusted under 35 U.S.C. 154(b) by 255 days.

(21) Appl. No.: 10/358,509

(22) Filed: Feb. 4, 2003

(65) Prior Publication Data
US 2004/0149885 A1 Aug. 5, 2004

(51) Int. Cl.$^7$ .............................................. H01L 27/00
(52) U.S. Cl. ..................... 250/208.1; 358/474; 359/819
(58) Field of Search .............................. 250/208.1, 216, 250/239; 358/474, 484; 359/811, 819, 822, 823, 827, 698, 701

(56) References Cited

U.S. PATENT DOCUMENTS 6,710,945 B1 * 3/2004 Miranda ..................... 359/819
2002/0006687 A1 * 1/2002 Lam ........................... 438/118
2003/0209787 A1 * 11/2003 Kondo et al. ................ 257/673
2004/0113048 A1 * 6/2004 Tu ........................... 250/208.1

* cited by examiner

Primary Examiner—Stephone B. Allen
(74) Attorney, Agent, or Firm—Pro-Techtor Int'l Services

(57) ABSTRACT

An injection molded image sensor module includes an image sensor, an injection molded body for sealing the image sensor, a lens barrel and an aspheric lens. The image sensor includes a substrate, a frame layer on the substrate, a photosensitive chip electrically connected to the substrate, and a transparent layer placed on a top of the frame layer so that the photosensitive chip may receive optical signals passing through the transparent layer. The injection molded body has a first end face, a second end face, a hole and an internal thread formed in the hole so that the image sensor may receive the optical signals passing through the hole. The lens barrel has an external thread, a chamber and a transparent region. The external thread is screwed to the hole of the injection molded body. The aspheric lens is arranged within the chamber and under the transparent region.

3 Claims, 2 Drawing Sheets

INJECTION MOLDED IMAGE SENSOR MODULE

BACKGROUND OF THE INVENTION

1. Field of the Invention

The invention relates to an image sensor module, and in particular to an injection molded image sensor module capable of receiving optical signals more precisely.

2. Description of the Related Art

Referring to FIG. 1, a conventional image sensor module includes a lens holder 10, a lens barrel 20, and an image sensor 30. The lens holder 10 has a top face 12, a bottom face 14 and a hole 16 penetrating through the lens holder 10 from the top face 12 to the bottom face 14. An internal thread 18 is formed on an inner wall of the hole 16 of the lens holder 10. The lens barrel 20 formed with an external thread 22 is inserted from the top face 12 of the lens holder 10, received within the hole 16, and screwed to the internal thread 18 of the lens holder 10. The lens barrel 20 is formed with a transparent region 24 under which an aspheric lens 26 and an infrared filter 28 are arranged in sequence. The image sensor 30 has a first surface 32 and a second surface 34 opposite to the first surface 32 on which a transparent layer 36 is arranged. The image sensor 30 is bonded to the bottom face 14 of the lens holder 10 through the transparent layer 36. The screwed length between the lens barrel 20 and the lens holder 10 may be adjusted to control the distance from the aspheric lens 26 of the lens barrel 20 to the transparent layer 36 of the image sensor 30.

However, if the transparent layer 36 of the image sensor 30 is not precisely positioned within the hole 16 of the lens holder 10, the received optical signals may be shifted.

SUMMARY OF THE INVENTION

An object of the invention is to provide an injection molded image sensor module capable of positioning an image sensor and a lens barrel more precisely and receiving optical signals more precisely.

To achieve the above-mentioned object, the invention provides an injection molded image sensor module including an image sensor, an injection molded body for sealing the image sensor, a lens barrel and an aspheric lens. The image sensor includes a substrate, a frame layer arranged on the substrate, a photosensitive chip electrically connected to the substrate, and a transparent layer placed on a top of the frame layer so that the photosensitive chip may receive optical signals passing through the transparent layer. The injection molded body has a first end face, a second end face, a hole and an internal thread formed on an inner wall of the hole so that the image sensor may receive the optical signals passing through the bole. The lens barrel has an external thread, a chamber and a transparent region. The external thread is screwed to the hole of the injection molded body. The aspheric lens is arranged within the chamber and under the transparent region.

Consequently, the image sensor may receive optical signals passing through the aspheric lens and the transparent region. According to the above-mentioned structure, the transparent layer does not have to be adhered to the lens holder, and the misaligmnent problem in the prior art may be overcome.

DETAILED DESCRIPTION OF THE INVENTION

Figure 1:
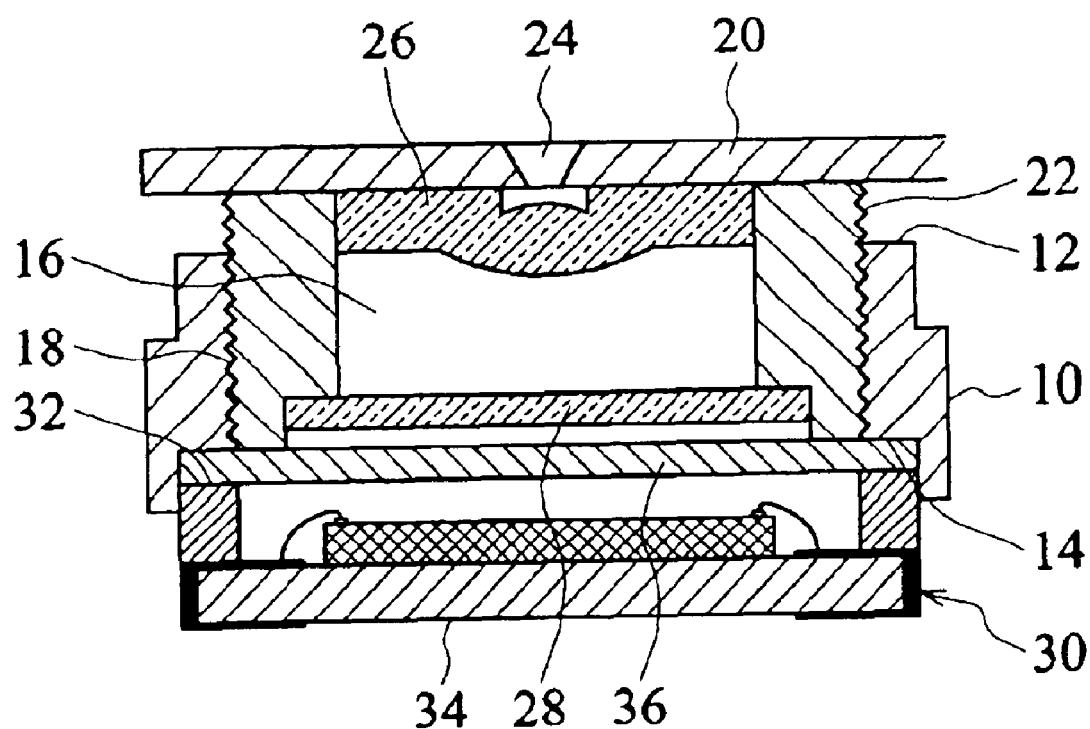
FIG. 1 is a cross-sectional view showing a conventional image sensor module.
Figure 2:
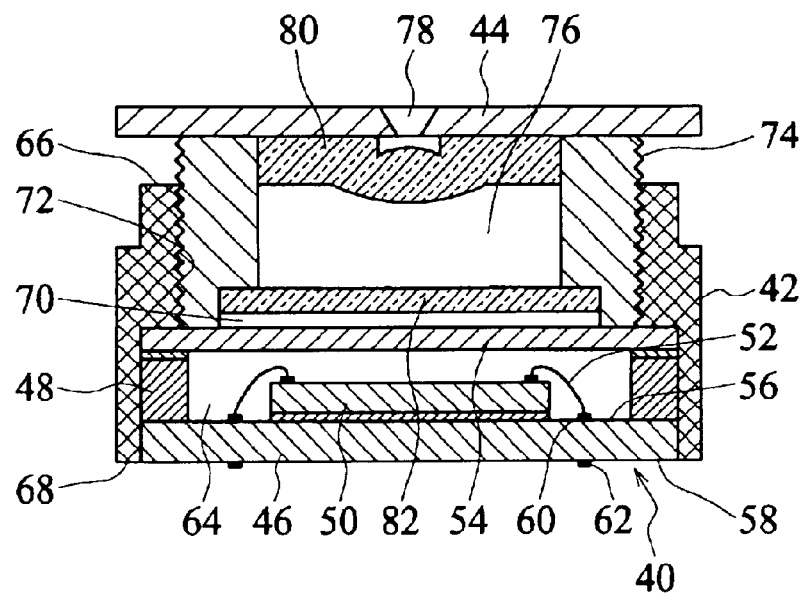
FIG. 2 is a cross-sectional view showing an injection molded image sensor module of the invention.
Figure 3:
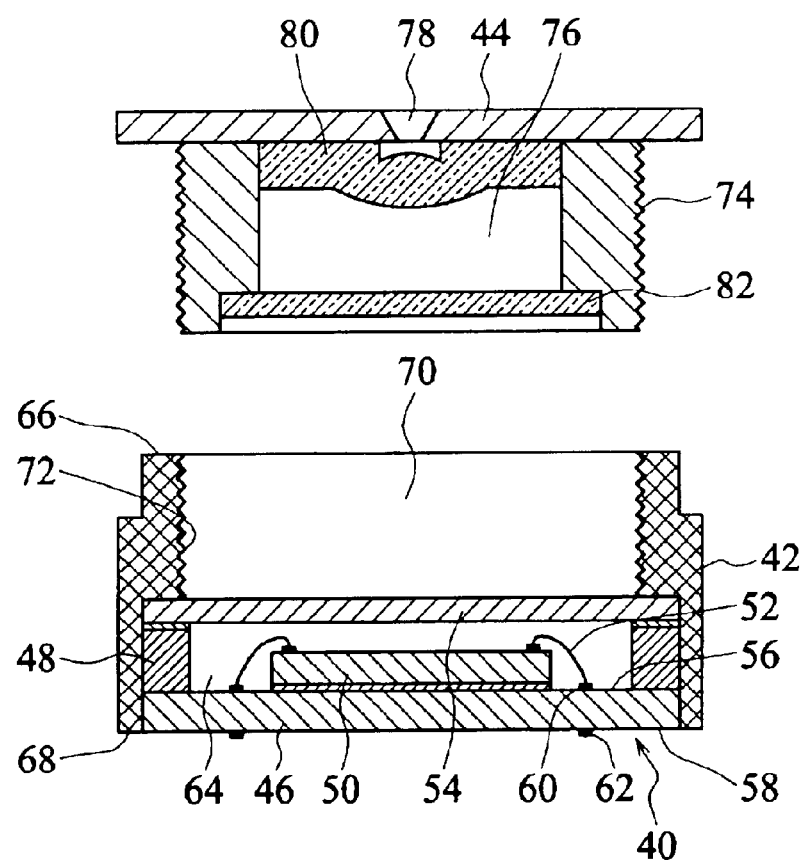
FIG. 3 is an exploded, cross-sectional view showing the injection molded image sensor module of the invention.

Referring to FIGS. 2 and 3, an injection molded image sensor module of the invention includes an image sensor 40, an injection molded body 42 and a lens barrel 44.

The image sensor 40 includes a substrate 46, a frame layer 48, a photosensitive chip 50, a plurality of wires 52 and a transparent layer 54. The substrate 46 has an upper surface 56 on which a plurality of first connection points 60 is formed, and a lower surface 58 on which a plurality of second connection points 62 is formed. The frame layer 48 is arranged on the upper surface 56 of the substrate 46 to form a cavity 64 together with the substrate 46. The photosensitive chip 50 is arranged within the cavity 64 and is electrically connected to the first connection points 60 of the substrate 46 by the wires 52, respectively. The transparent layer 54 is placed on a top of the frame layer 48. Then, the photosensitive chip 50 may receive optical signals passing through the transparent layer 54.

The injection molded body 42 is made of an industrial plastic by way of injection molding to seal and surround the image sensor 40. The injection molded body 42 has a first end face 66, a second end face 68, a hole 70, and an internal thread 72 formed on an inner wall of the hole 70. The second connection points 62 of the image sensor 40 are exposed from the second end face 68 and are electrically connected to a printed circuit board. Then, the image sensor 40 may receive optical signals passing through the hole 70 of the injection molded body 42.

The lens barrel 44 has an external thread 74, a chamber 76 and a transparent region 78. The external thread 74 is screwed to the hole 70 of the injection molded body 42, and an aspheric lens 80 and an infrared filter 82 are arranged within the chamber 76 from top to bottom.

According to the above-mentioned structure, after the image sensor 40 has been packaged, an industrial plastic is injection molded to seal and surround the image sensor in order to form the injection molded body 42. At this time, the transparent layer 54 of the image sensor 40 may be precisely positioned and fixed by the injection molded body 42. The hole 70 and the internal thread 72 are also formed when the injection molded body 42 is formed. Consequently, the lens barrel 44 may be directly screwed to the hole 70 of the injection molded body 42, and the transparent layer 54 of the image sensor 40 may be precisely positioned and aligned with the lens barrel 44 so that the image sensor may precisely receive optical signals. Therefore, it is possible to solve the conventional problem of misalignment of the image sensor and the lens barrel.

While the invention has been described by way of an example and in terms of a preferred embodiment, it is to be understood that the invention is not limited to the disclosed embodiment. To the contrary, it is intended to cover various modifications. Therefore, the scope of the appended claims should be accorded the broadest interpretation so as to encompass all such modifications.

What is claimed is:

1. An injection molded image sensor module, comprising:

an image sensor comprising a substrate, a frame layer arranged on the substrate, a photosensitive chip electrically connected to the substrate, and a transparent layer placed on a top of the frame layer so that the photosensitive chip may receive optical signals passing through the transparent layer;

an injection molded body for sealing the image sensor, the injection molded body having a first end face, a second end face, a hole and an internal thread formed on an inner wall of the hole so that the image sensor may receive the optical signals passing through the hole;

a lens barrel having an external thread, a chamber and a transparent region, the external thread being screwed to the bole of the injection molded body; and an aspheric lens arranged within the chamber and under the transparent region.

2. The injection molded image sensor module according to claim 1, wherein the transparent layer is a piece of transparent glass.

3. The injection molded image sensor module according to claim 1, further comprising an infrared filter arranged within the chamber of the lens barrel.

* * * * *